United States Patent [19]
Kim

[11] Patent Number: 5,879,967
[45] Date of Patent: Mar. 9, 1999

[54] METHODS FORMING POWER SEMICONDUCTOR DEVICES HAVING LATCH-UP INHIBITING REGIONS

[75] Inventor: Tae-Hoon Kim, Kyungki-do, Rep. of Korea

[73] Assignee: Samsung Electronics Co., Ltd., Suwon, Rep. of Korea

[21] Appl. No.: 788,372

[22] Filed: Jan. 27, 1997

[30] Foreign Application Priority Data

Jan. 26, 1996 [KR] Rep. of Korea ................ 1996-1676

[51] Int. Cl.$^6$ .................................................. H01L 21/332
[52] U.S. Cl. ......................... 438/133; 438/138; 438/268
[58] Field of Search .................................. 438/133, 195, 438/138, 268, 269; 257/378

[56] References Cited

U.S. PATENT DOCUMENTS

| | | | |
|---|---|---|---|
| 4,587,713 | 5/1986 | Goodman et al. | 438/273 |
| 5,034,336 | 7/1991 | Seki | 437/29 |
| 5,057,884 | 10/1991 | Suzuki et al. | 357/23.4 |
| 5,245,202 | 9/1993 | Yasukazu | 257/133 |
| 5,326,993 | 7/1994 | Iwamuro | 257/139 |
| 5,349,212 | 9/1994 | Seki | 257/133 |
| 5,396,087 | 3/1995 | Baliga | 257/139 |
| 5,397,905 | 3/1995 | Otsuki et al. | 257/133 |
| 5,428,228 | 6/1995 | Ogura et al. | 257/138 |
| 5,444,273 | 8/1995 | Ueno | 257/138 |
| 5,453,390 | 9/1995 | Nizhizawa et al. | 438/138 |
| 5,485,023 | 1/1996 | Sumida | 257/139 |
| 5,488,236 | 1/1996 | Baliga et al. | 257/132 |
| 5,595,918 | 1/1997 | Kinzer | 438/138 |

OTHER PUBLICATIONS

Lee et al., *Latch–up Suppressed Insulate Gate Bipolar Transistor by the Deep p+ Ion Implantation under the n+ Source*, Jpn. J. Appl. Phys. vol. 33, Part 1, No. 1B, Jan. 1994, pp. 563–566.

*Primary Examiner*—Tuan H. Nguyen
*Attorney, Agent, or Firm*—Myers Bigel Sibley & Sajovec

[57] ABSTRACT

Methods of forming power semiconductor devices include the steps of forming a relatively highly doped latch-up inhibiting region to suppress the likelihood of parasitic thyristor latch-up in a power semiconductor device such as an insulated-gate bipolar transistor (IGBT). In particular, an insulated-gate bipolar transistor is formed by patterning an insulated gate electrode on a surface of a drift region and then implanting first dopants of second conductivity type (e.g., P-type) at a first depth into the drift region, using the gate electrode as an implant mask. The implanted first dopants are then diffused using a thermal treatment to form a base region (e.g., P– well region). Second dopants of second conductivity type are then implanted into the base region at a second depth, less than the first depth, using the insulated gate electrode as a mask. Third dopants of first conductivity type (e.g., N-type) are also implanted into the base region at a third depth, less than the second depth, using the insulated gate electrode as an implant mask. These opposite conductivity type dopants are then simultaneously diffused laterally and vertically in the base region to define a relatively wide and highly doped latch-up inhibiting region (e.g., P-type) and at least one source region disposed between the latch-up inhibiting region and the surface of the drift region. By implanting the second and third dopants using the same implant mask and then diffusing these dopants simultaneously and for the same duration, a latch-up inhibiting region can be formed as wide in the base region as the at least one source region, when the regions are viewed in transverse cross-section. This inhibits the likelihood that the P-N junction at the edge of the at least one source region will become forward biased during high forward current conduction.

18 Claims, 9 Drawing Sheets

5,879,967

METHODS FORMING POWER SEMICONDUCTOR DEVICES HAVING LATCH-UP INHIBITING REGIONS

FIELD OF THE INVENTION

The present invention relates to semiconductor devices, and more particularly to power semiconductor devices and methods of forming same.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under appropriate bias. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, however, by the high on-resistance of the MOSFET's active region, which arises from the absence of minority carrier injection. As a result, the device's operating forward current density is limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. Classes of such hybrid devices include various types of MOS-gated thyristors as well as the insulated gate bipolar transistor (IGBT), also commonly referred to by the acronyms COMFET (Conductivity-Modulated FET) and BIFET (Bipolar-mode MOSFET). Related hybrid devices are also disclosed in U.S. Pat. No. 5,396,087 to Baliga entitled *Insulated Gate Bipolar Transistor with Reduced Susceptibility to Parasitic Latch-Up*, U.S. Pat. No. 5,488,236 to Baliga et al. entitled *Latch-Up Resistant Bipolar Transistor with Trench IGFET and Buried Collector*, and U.S. Pat. No. 5,034,336 to Seki entitled *Method of Producing Insulated Gate Bipolar Transistor*.

One example of an insulated-gate bipolar transistor (IGBT) is illustrated by FIG. 1. In particular, FIG. 1 illustrates a conventional IGBT comprising a vertical PNP bipolar transistor (BJT) and a lateral N-channel MOSFET for controlling turn-on and turn-off of the vertical BJT. As illustrated, a P+ emitter region 12 is provided as a substrate on which an N+ buffer region 13 is formed. A relatively thick and lightly doped N− drift region 14 is also provided on the buffer region, opposite the emitter region 12. A P-type base or collector region 19 is also provided in the drift region 14 and extends to an upper surface thereof. A least one source region 25 is also provided in the base/collector region 19 and an insulated gate electrode, comprising an insulating layer 15 and a gate electrode 16, is provided on the upper surface, opposite a peripheral edge of the base region 19. As will be understood by those skilled in the art, forward conduction in the illustrated IGBT is established by forward biasing the emitter region 12 relative to the base/collector region 19 and applying a turn-on gate bias to the gate electrode 16. Upon application of a sufficient gate bias, an inversion-layer channel is formed in the base region 19, at a portion of the upper surface of the base region 19 extending between the source region 25 and the drift region 14. This inversion-layer channel (not shown) initiates turn-on by providing base drive current in the form of electrons to the drift region 14 (which acts as the "base" of the vertical PNP transistor). The magnitude of the gate bias needed to establish the inversion-layer channel is a function of the doping concentration in the base region 19, at the upper surface between the source region 25 and drift region 14. The base region 19 also acts as a collector of holes supplied by the emitter region 12, during forward conduction. These collected holes are then swept to a collector contact 29 which is electrically insulated from the gate electrode 16 by a sidewall insulating layer 28. Turn-off of the vertical bipolar transistor can also be achieved by eliminating the inversion-layer channel in the base region 19 by removing the gate bias. However, as explained below, forward current conduction may not always be terminated by removal of the gate bias alone.

As will be understood by those skilled in the art, the base/collector region 19 may be formed by implanting P-type dopants into the upper surface of the drift region 14, using the insulated gate electrode as an implant mask and then diffusing the implanted P-type dopants. The at least one source region 25 may also be formed as an annular-shaped source region in a polygonal-shaped base region 19 (e.g., circular, square, hexagonal, etc.) or as a pair of parallel stripes in a stripe-shaped base region 19, for example. To inhibit the likelihood that the parasitic P-N-P-N thyristor formed by regions 12–14, 19 and 25 will latch-up under high forward current conduction conditions, a central P+ contact region 30 may also be provided to lower the effective lateral resistance in the base region 19 and thereby reduce the magnitude of the forward bias appearing across the base/source junction. Thus, during heavy forward conduction, the P-N junction formed between the base region 19 and the at least one source region 25 will be less susceptible to turn-on. Such turn-on is necessary in order for the parasitic thyristor to latch-up. As will be understood by those skilled in the art, the central P+ contact region 30 may be formed by implanting P-type dopants into the base region 19, using the sidewall insulating layer 28 as an implant mask.

Unfortunately, notwithstanding the above described attempt to limit the likelihood of parasitic thyristor latch-up by incorporating a relatively highly doped P+ central contact region 30, there still continues to be a need for power semiconductor devices such as IGBTs which have reduced susceptibility to latch-up.

SUMMARY OF THE INVENTION

It is therefore an object of the present invention to provide improved methods of forming power semiconductor devices and devices formed thereby.

It is another object of the present invention to provide methods of forming insulated-gate power semiconductor devices having reduced susceptibility to parasitic thyristor latch-up and devices formed thereby.

These and other objects, features and advantages of the present invention are provided by methods of forming power semiconductor devices which include the steps of forming a relatively highly doped latch-up inhibiting region to suppress the likelihood of parasitic thyristor latch-up in a power semiconductor device such as an insulated-gate bipolar transistor (IGBT). In particular, according to a preferred embodiment of the present invention, an insulated-gate bipolar transistor is formed initially by forming a buffer region of first conductivity type (e.g., N+) on a face of a semiconductor substrate of second conductivity type (e.g., P+) and then forming a more lightly doped drift region (e.g., N−) on the buffer region. An insulated gate electrode is then formed on a surface of the drift region and then first dopants of second conductivity type (e.g., P-type) are implanted at a first depth into the drift region, using the gate electrode as an implant mask. The implanted first dopants are then diffused using a thermal treatment to form a base region (e.g., P− well region) which forms a P-N junction with the drift region.

Second dopants of second conductivity type are then implanted into the base region at a second depth, less than the first depth, using the insulated gate electrode as a mask. Third dopants of first conductivity type (e.g., N-type) are then implanted into the base region at a third depth, less than the second depth, using the insulated gate electrode and a patterned nitride layer as implant masks. These opposite conductivity type dopants are then simultaneously diffused laterally and vertically in the base region to define a relatively wide and highly doped latch-up inhibiting region (e.g., P-type) and at least one source region disposed between the latch-up inhibiting region and the surface of the drift region. By implanting the second and third dopants using the same implant mask and then diffusing these dopants simultaneously and for the same duration, a latch-up inhibiting region can be formed as wide in the base region as the at least one source region, when the regions are viewed in transverse cross-section. This means the entire bottom(s) of the at least one source region is formed in contact with the relatively highly doped latch-up inhibiting region, instead of the more lightly doped base region. This inhibits the likelihood that the P-N junction at the edge of the at least one source region will become forward biased during high forward current conduction. In addition, to further reduce the lateral resistance of the base region and further limit the likelihood of parasitic thyristor latch-up, fourth dopants of second conductivity type are also implanted into the at least one source region and latch-up inhibiting region, using the gate electrode as a mask, and then diffused to form a relatively highly doped contact region in the latch-up inhibiting region.

DETAILED DESCRIPTION OF PREFERRED EMBODIMENTS

Figure 1:
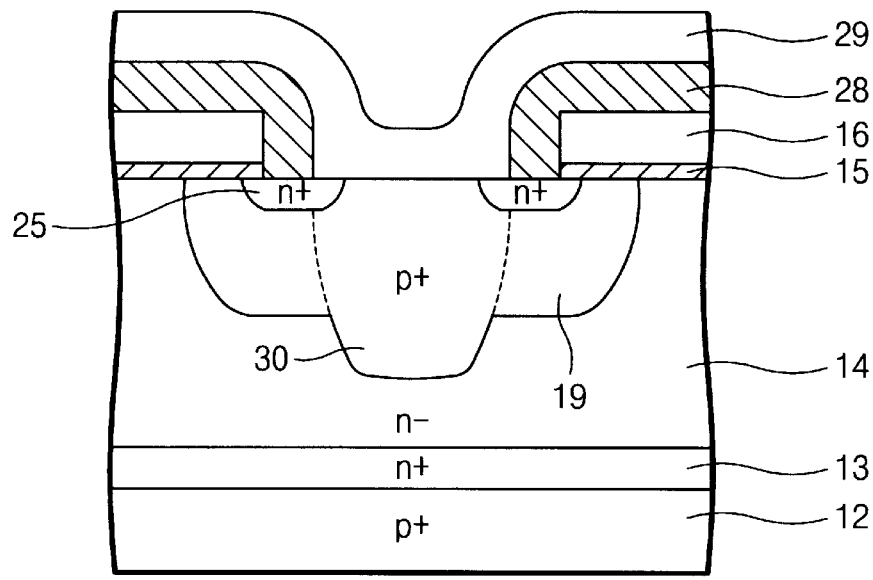
FIG. 1 is a schematic cross-sectional view of an insulated-gate bipolar transistor according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Moreover, the terms "first conductivity type" and "second conductivity type" refer to opposite conductivity types such as N or P-type, however, each embodiment described and illustrated herein includes its complementary embodiment as well.

Referring now to FIGS. 2 and 3A–3I, a preferred method of forming a power semiconductor device containing a latch-up inhibiting region therein will now be described. In particular, as illustrated best by FIG. 3A, a preferred method may include the initial steps of forming a composite semiconductor substrate by epitaxially growing a relatively thin and highly doped buffer region 13 of first conductivity type (shown as N+) on a face of a semiconductor region 12 of second conductivity type (shown as P+) and then epitaxially growing a relatively thick and lightly doped drift region 14 of first conductivity type (shown as N−) on the buffer region 13. Here, the buffer region 13 and drift region 14 may be doped in-situ during the epitaxial growth steps with phosphorus ions.

Figure 3A:
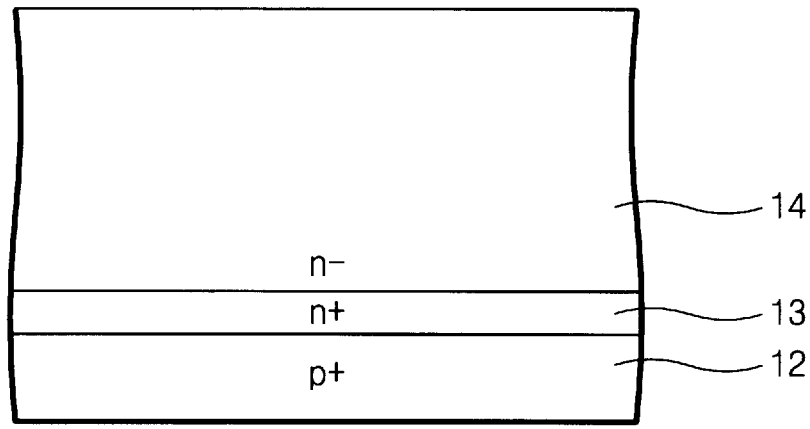
FIGS. 3A–3I are schematic cross-sectional views of intermediate structures illustrating a method of forming a power semiconductor device according to a first embodiment of the present invention.
Figure 3B:
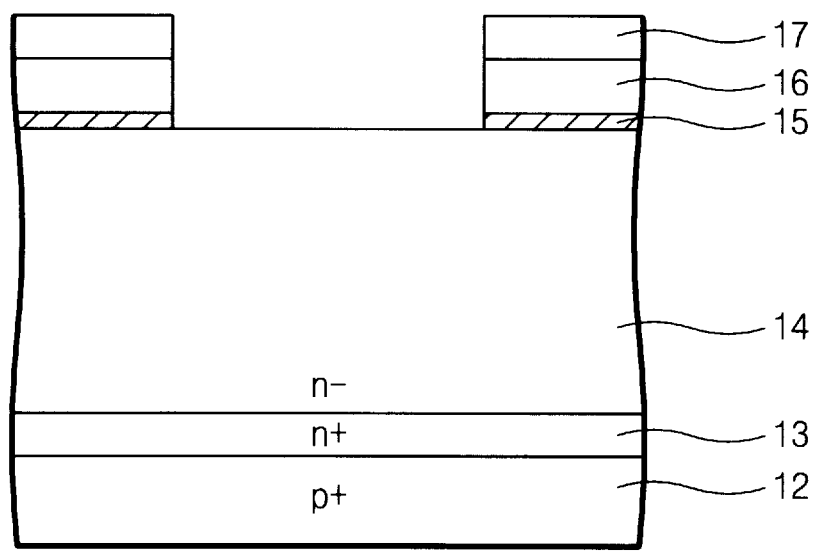
Figure 3C:
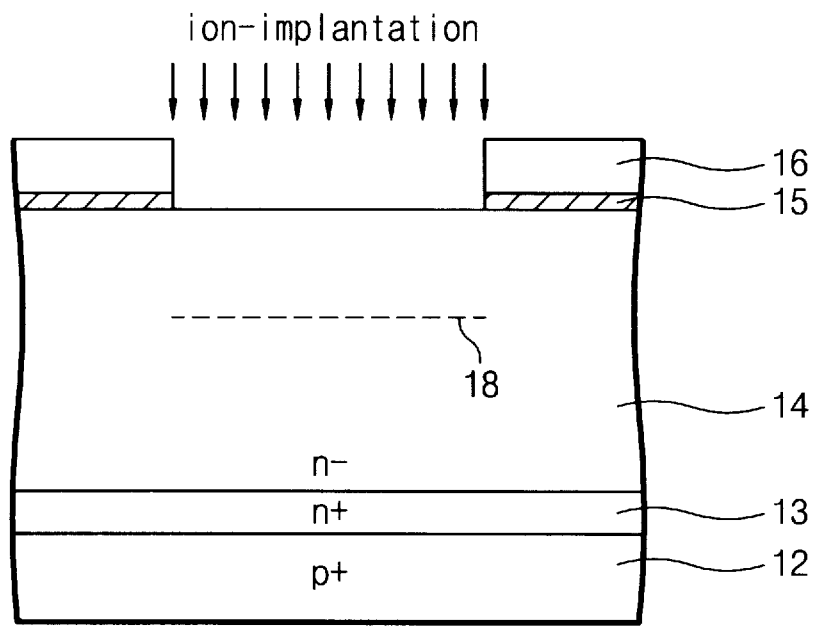
Figure 3D:
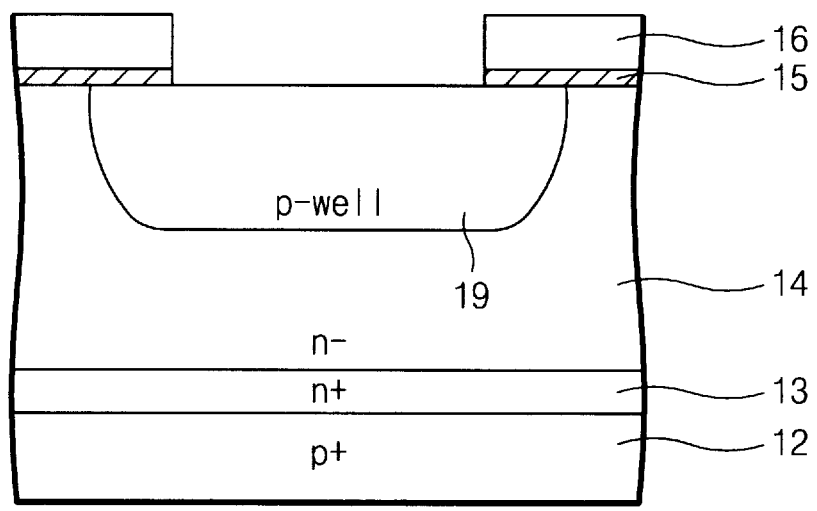

As best illustrated by FIG. 3B, a gate oxide layer 15, a gate electrode layer 16 and a photoresist layer 17 may then be formed on a face of the drift region 14. Here, the gate electrode layer 16 may comprise an undoped or in-situ doped layer of polycrystalline silicon, for example. Conventional photolithography and etching steps are then preferably performed to define an opening in the gate oxide layer 15 and gate electrode layer 16 which exposes the face of the drift region 14. Referring now to FIG. 3C, first dopants of second conductivity type (e.g., P-type) are then implanted into the drift region 14 at a first depth relative to the face (as illustrated by dotted line 18 which represents the position of the peak concentration of implanted dopants), using the patterned gate electrode layer 16 as an implant mask. The implanted first dopants are then diffused to substantially their final depths using a thermal treatment to form a relatively lightly doped base region 19, as illustrated best by FIG. 3D.

Figure 3E:
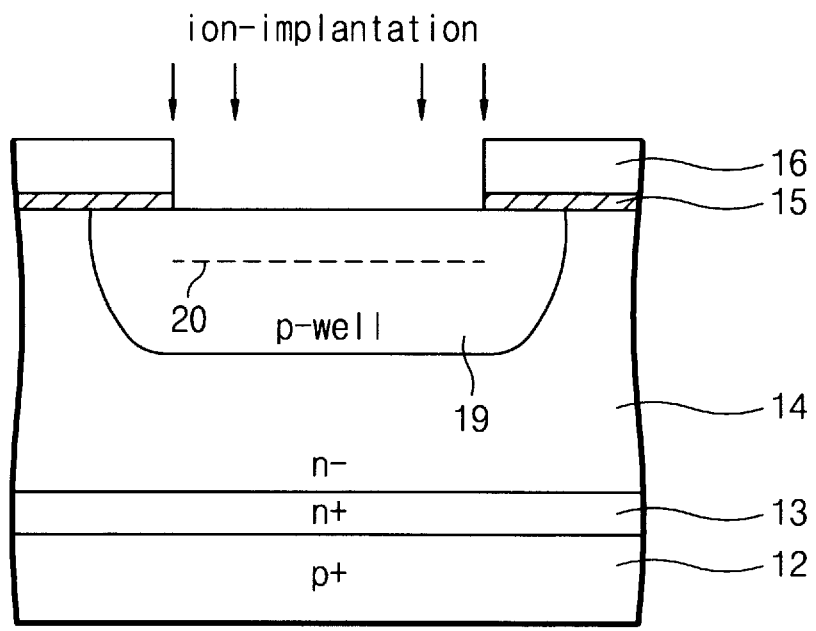
Figure 3F:
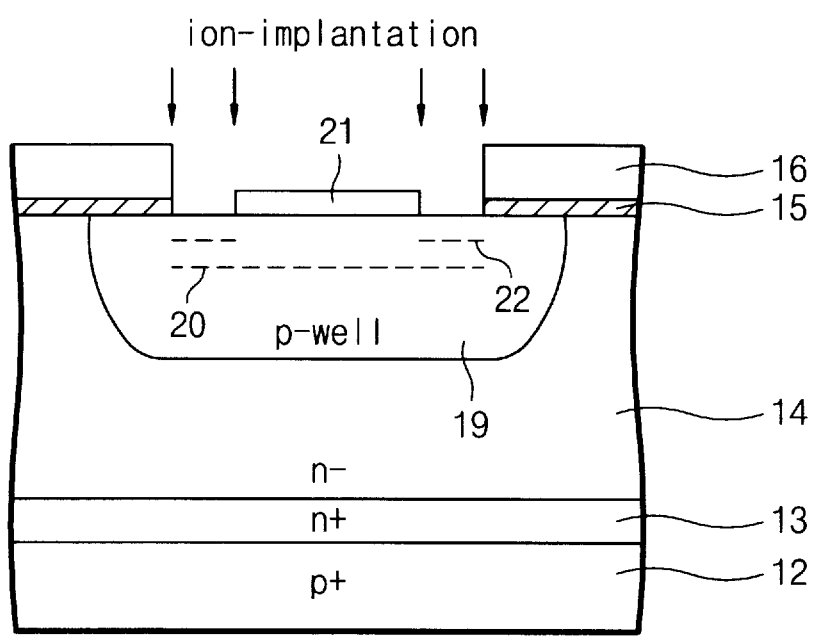

Referring now to FIGS. 3E–3F, second dopants of second conductivity type (e.g., P-type) are then implanted into the base region 19 at a second depth, less than the first depth, using the patterned gate electrode layer 16 as an implant mask. Here, the dotted line 20 represents the position of the peak concentration of the implanted second dopants. A masking layer which may comprise a layer of silicon nitride, is then patterned in the opening as a source implant mask 21, as illustrated. Third dopants of first conductivity type (e.g., N-type) are then implanted into the base region 19 at a third depth, less than the second depth, using the patterned gate electrode layer 16 and source implant mask 21 as implant masks. Here, the dotted line 22 represents the position of the peak concentration of the implanted third dopants.

Figure 3G:
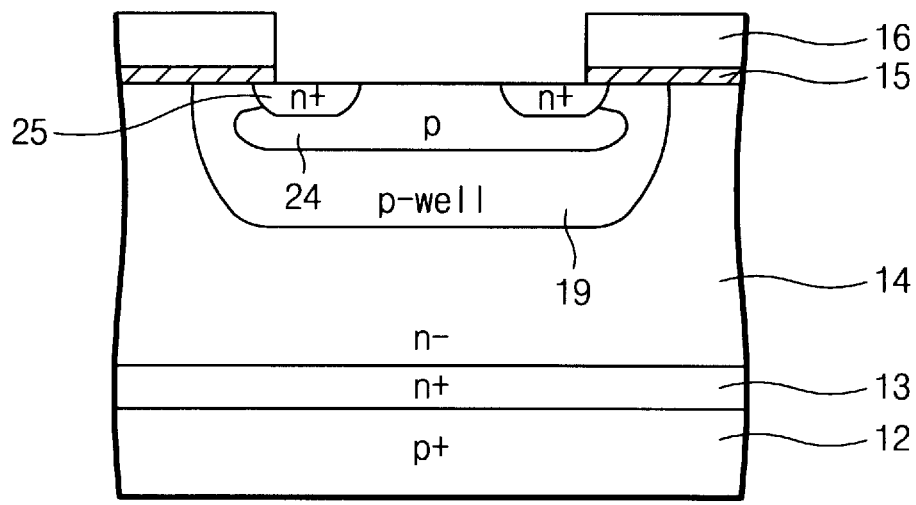

Referring now to FIG. 3G, the implanted second and third dopants are then diffused simultaneously into the base region 19 to define a latch-up inhibiting region 24 and at least one source region 25 extending between the latch-up inhibiting region 24 and the face of the drift region 14. By implanting the second and third dopants using the same implant mask (e.g., the patterned gate electrode layer 16) and then diffusing these dopants simultaneously and for the same duration, a latch-up inhibiting region 24 can be formed as wide in the base region 19 as the at least one source region 25, when the regions are viewed in transverse cross-section. This means the entire bottom(s) of the at least one source region 25 is formed in contact with the relatively highly doped latch-up inhibiting region 24, instead of the more lightly doped base region 19. This inhibits the likelihood that the P-N junction at the edge of the at least one source region will become forward biased during high forward current conduction, as explained more fully hereinbelow. As will be understood by those skilled in the art, the source region 25 may be formed as an annular-shaped source region in a polygonal-shaped base region 19 (e.g., circular, square, hexagonal, etc.) or as a pair of parallel stripes in a stripe-shaped base region 19, for example.

Figure 3H:
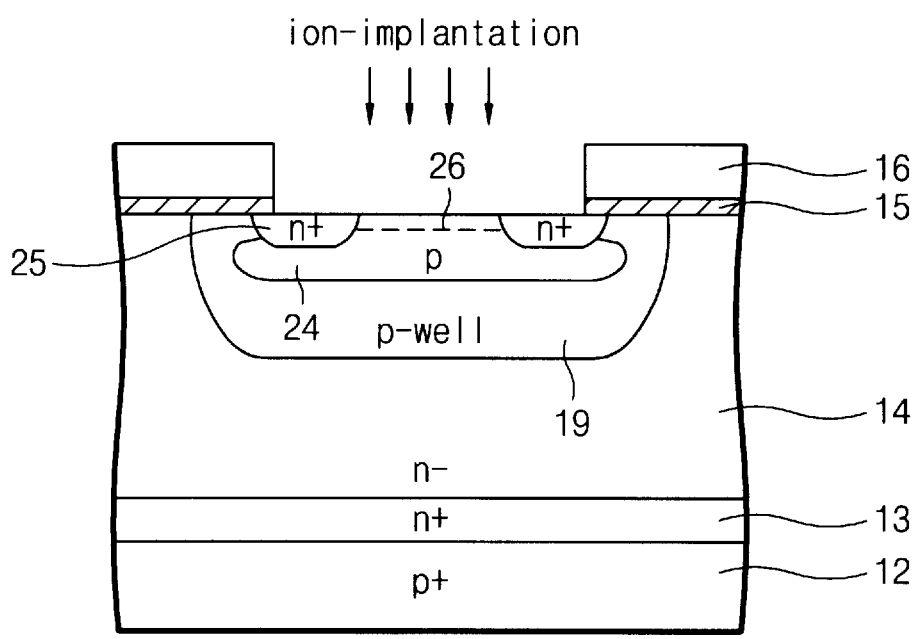
Figure 3I:
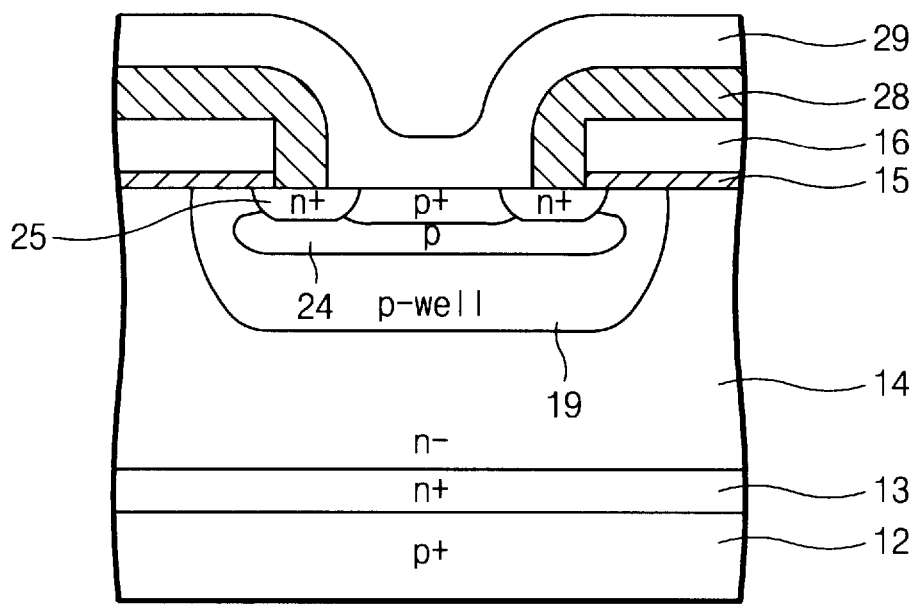

Referring now to FIG. 3H, fourth dopants of second conductivity type (e.g., P-type) are then implanted into the latch-up inhibiting region 24 at a fourth depth, less than the third depth, using the patterned gate electrode 16 as an implant mask. Here, the dotted line 26 represents the position of the peak concentration of the implanted fourth dopants. These fourth dopants are preferably implanted to further reduce the overall lateral resistance of the base region 19 and, as explained below, further limit the likelihood of parasitic thyristor latch-up. As best illustrated by FIG. 3I, the implanted fourth dopants are then diffused to form a relatively highly doped contact region 27 and a sidewall insulating region 28 is patterned on the sidewalls and the top surface of the gate electrode 16 to define a contact opening. Metallization is then deposited in the contact opening to form a cathode contact 29 which ohmically contacts the at least one source region 25 and the contact region 27. The contact region 27 may be formed by performing a separate thermal treatment step in addition to the step of implanting the fourth dopants, however, sufficient thermal treatment may be obtained during the step of forming the sidewall insulating region 28.

Accordingly, by providing a relatively wide latch-up inhibiting region 24 and a very highly doped contact region 27, the effective lateral resistance in the base region 19 can be substantially reduced without adversely influencing the turn-on characteristics (i.e., Vth) of the lateral turn-on MOSFET formed on the face, between the source region 25 and drift region 14. The inclusion of the wide latch-up inhibiting region to cover the entire bottom of the source region 25 also limits the likelihood of parasitic thyristor latch-up by reducing the forward potential across the P-N junction formed between the source region 25 and the latch-up inhibiting region 24 during high forward current conditions. By preventing the P-N junction from becoming sufficiently forward biased to cause turn on, latch-up of the parasitic thyristor (formed between the emitter region 12, buffer and drift regions 13–14, base region 19 and source region 25) can be prevented. The use of a more heavily doped contact region 27 also improves the characteristics of the ohmic contact formed between the cathode contact 29 and the contact region 27.

Figure 2:
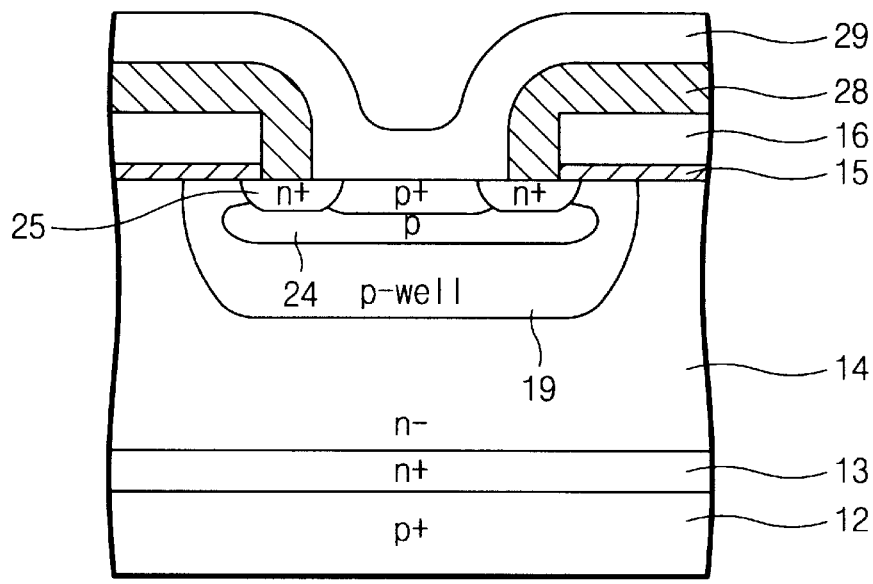
FIG. 2 is a schematic cross-sectional view of a power semiconductor device according to one embodiment of the present invention.
Figure 4A:
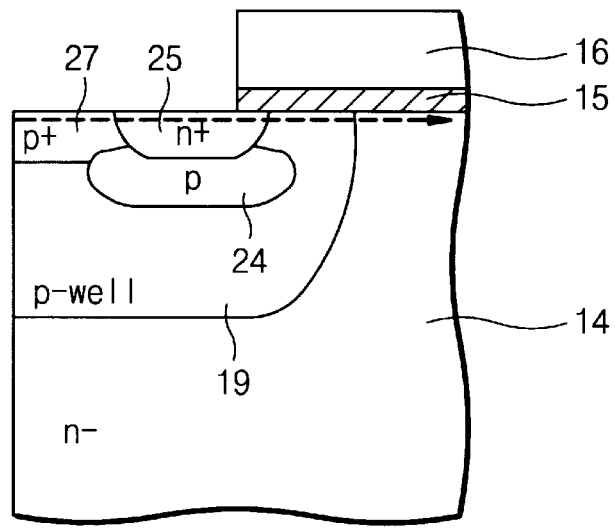
FIG. 4A is a schematic cross-sectional view of a portion of the power semiconductor device of FIG. 2.
Figure 4B:
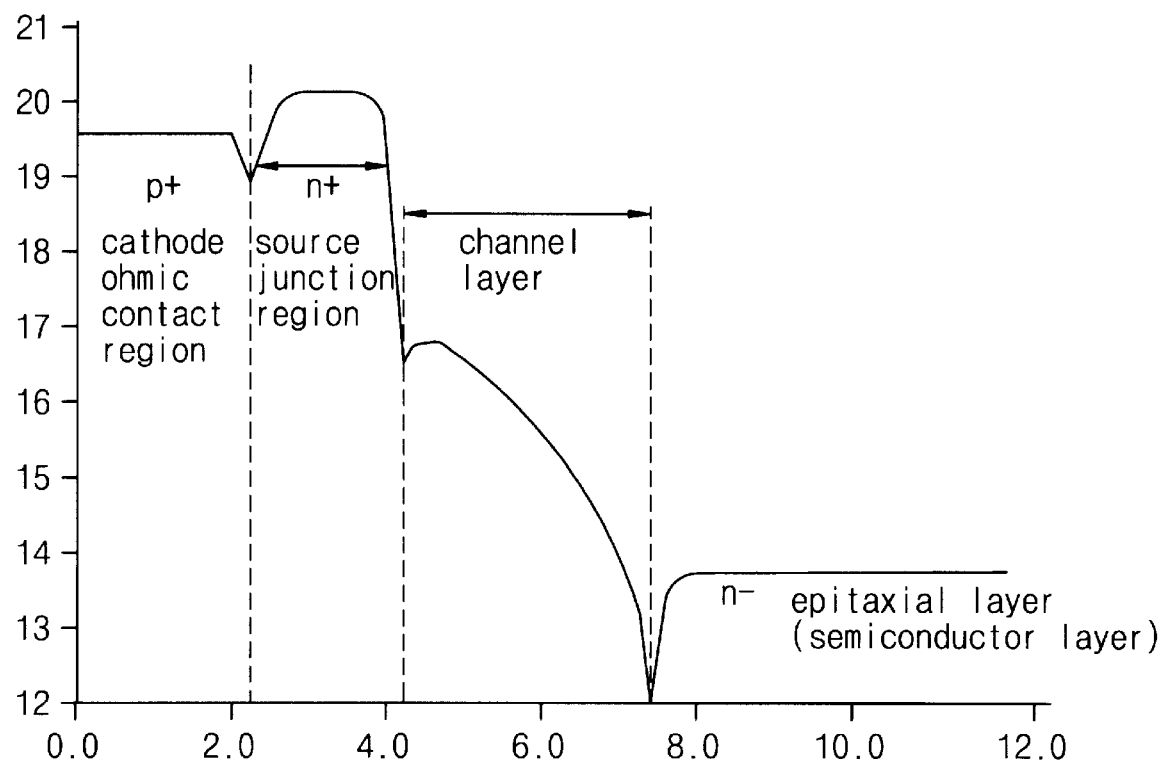
FIG. 4B is a graphical illustration of dopant impurity concentration as a function of lateral distance extending in the direction of the arrow in FIG. 4A.
Figure 5A:
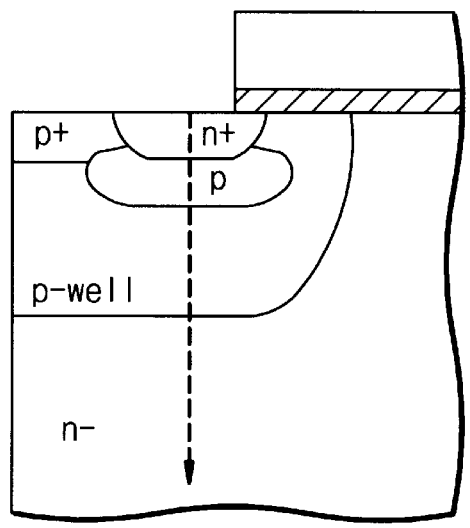
FIG. 5A is a schematic cross-sectional view of a portion of the power semiconductor device of FIG. 2.
Figure 5B:
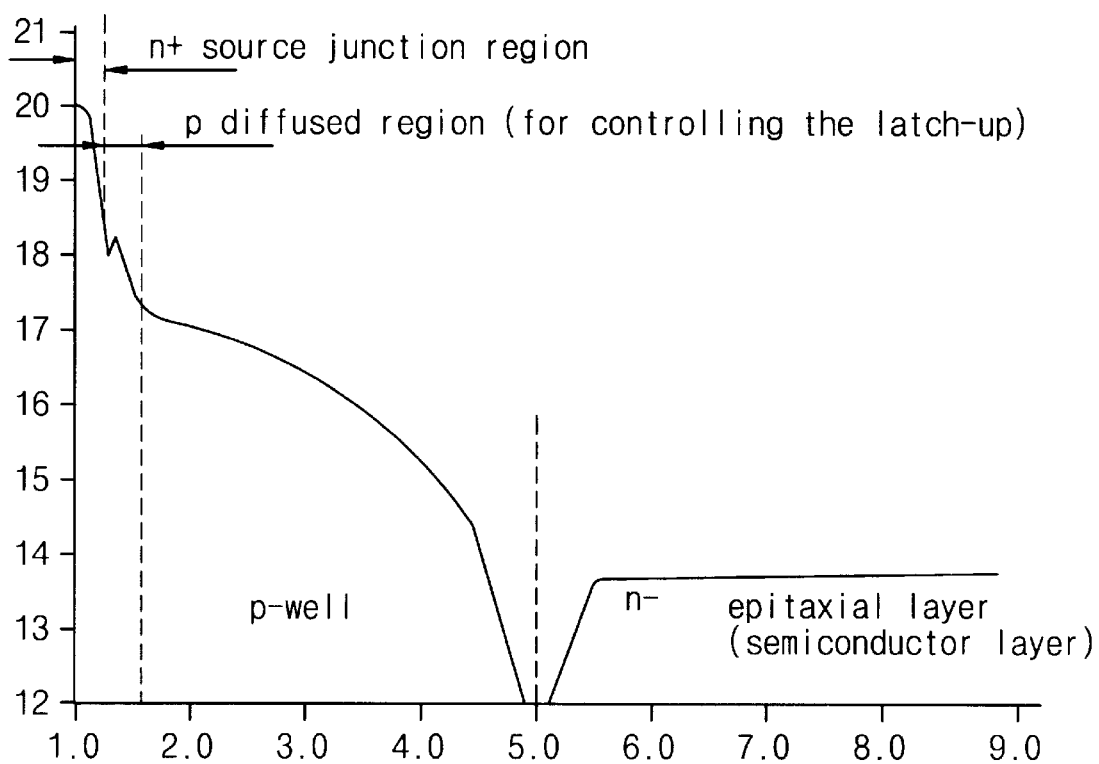
FIG. 5B is a graphical illustration of dopant impurity concentration as a function of vertical distance extending in the direction of the arrow in FIG. 5A.
Figure 6A:
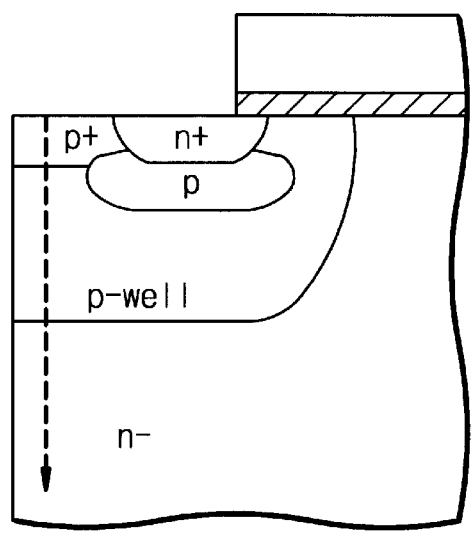
FIG. 6A is a schematic cross-sectional view of a portion of the power semiconductor device of FIG. 2.
Figure 6B:
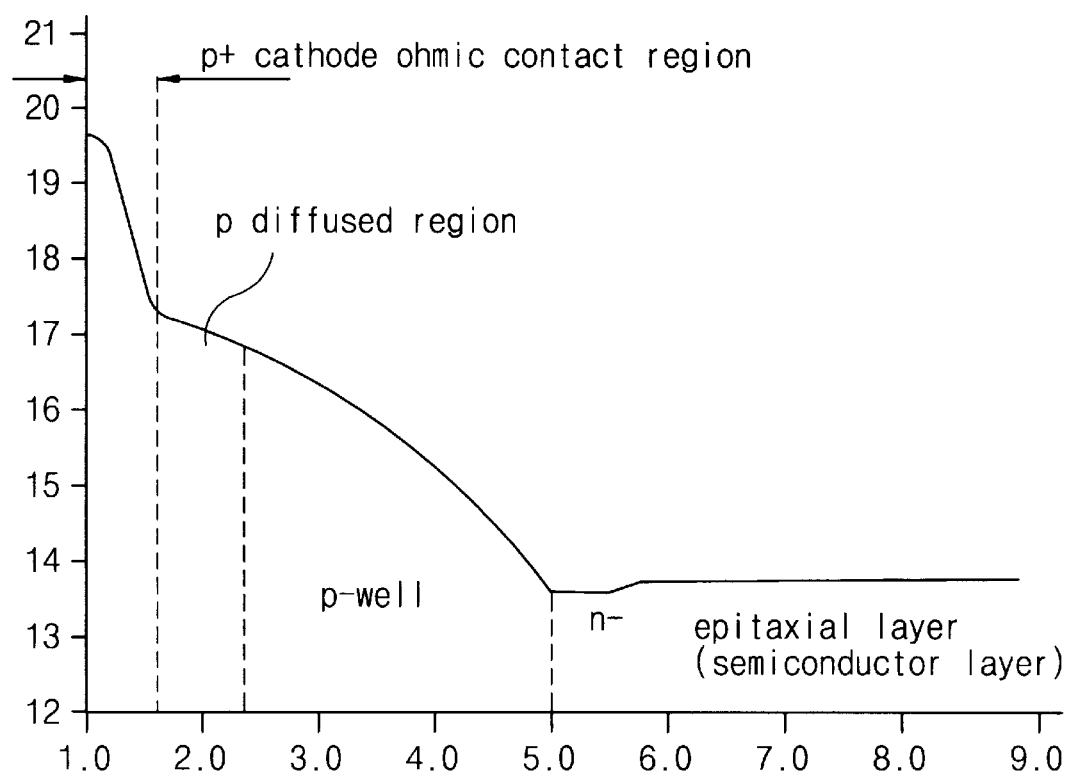
FIG. 6B is a graphical illustration of dopant impurity concentration as a function of vertical distance extending in the direction of the arrow in FIG. 6A.

Referring now to FIG. 4A, a schematic cross-sectional view of a portion of the power semiconductor device of FIGS. 2 and 3I is illustrated. In FIG. 4B, a graphical illustration of dopant impurity concentration as a function of lateral distance extending in the direction of the arrow in FIG. 4A is also provided. Here, the doping concentration in the contact region 27 is set to a level greater than $1 \times 10^{19}$ cm$^{-3}$, the doping concentration in the source region 25 is set to a level of about $1 \times 10^{20}$ cm$^{-3}$, the doping concentration in the channel portion of the base region 19 is set to a level less than about $1 \times 10^{17}$ and the doping concentration in the drift region 14 is set to a level of about $1 \times 10^{14}$ cm$^{-3}$. Referring now to FIG. 5A, a schematic cross-sectional view of a portion of the power semiconductor device of FIGS. 2 and 3I is illustrated. In FIG. 5B, a graphical illustration of dopant impurity concentration as a function of vertical distance (i.e., depth) extending in the direction of the arrow in FIG. 5A is also provided. Here, the doping concentration in the source region 25 is set to a level of about $1 \times 10^{20}$ cm$^{-3}$, the doping concentration in the latch-up inhibiting region 24 is set to a level of about $1 \times 10^{18}$ cm$^{-3}$ and the doping concentration in the portion of the base region 19 extending underneath the latch-up inhibiting region 24 is set to a level less than about $1 \times 10^{17}$. Referring now to FIG. 6A, a schematic cross-sectional view of a portion of the power semiconductor device of FIGS. 2 and 3I is illustrated. In FIG. 6B, a graphical illustration of dopant impurity concentration as a function of vertical distance (i.e., depth) extending in the direction of the arrow in FIG. 6A is also provided. Here, the doping concentration in the contact region 27 is set to a level greater than about $1 \times 10^{17}$ cm$^{-3}$, the doping concentration in the latch-up inhibiting region 24 is set to a level of about $1 \times 10^{18}$ cm$^{-3}$ and the doping concentration in the portion of the base region 19 extending underneath the latch-up inhibiting region 24 is set to a level less than about $1 \times 10^{17}$.

It is understood that various other modifications will be apparent to and can be readily made by those skilled in the art without departing from the scope and spirit of this invention. Accordingly, it is not intended that the scope of That which is claimed is:

1. A method of forming a power semiconductor device, comprising the steps of:

forming a semiconductor substrate having a region of first conductivity type therein extending to a face thereof implanting first dopants of second conductivity type into the face of the semiconductor substrate at a first depth relative to the face;

diffusing the implanted first dopants into the region of first conductivity type to define a base region of second conductivity type therein which forms a P-N junction with the region of first conductivity type;

implanting second dopants of second conductivity type into the base region at a second depth relative to the face which is less than the first depth;

forming a first mask on the face of the substrate, opposite the base region;

implanting third dopants of first conductivity type into the base region at a third depth relative to the face which is less than the second depth, using the first mask as an implant mask;

diffusing the implanted second and third dopants simultaneously into the base region to define a latch-up inhibiting region of second conductivity type extending to the face and at least one source region of first conductivity type extending between the latch-up inhibiting region and the face;

implanting fourth dopants of second conductivity type into the latch-up inhibiting region at a fourth depth relative to the face which is less than the second depth; and diffusing the implanted fourth dopants into the latch-up inhibiting region to define a contact region of second conductivity type extending to the face.

2. The method of claim 1, wherein said step of implanting fourth dopants comprises implanting fourth dopants into the substrate at the fourth depth relative to the face which is less than the third depth.

3. The method of claim 1, wherein said step of diffusing the implanted fourth dopants comprises simultaneously diffusing the first, second and third dopants into the substrate.

4. The method of claim 1, wherein said step of forming a first mask comprises the step of patterning a layer of nitride on a first portion of the face which extends opposite the base region; and wherein said step of implanting fourth dopants comprises implanting fourth dopants into the first portion of the face.

5. The method of claim 4, wherein said step of implanting fourth dopants is preceded by the step of removing the first mask from the face of the substrate.

6. The method of claim 1, wherein said step of implanting second dopants is preceded by the step of forming a second mask on the face of the substrate; and wherein said steps of implanting second and third dopants comprise implanting second and third dopants, respectively, using the second mask as an implant mask.

7. The method of claim 6, wherein said step of implanting first dopants is preceded by said step of forming a second mask on the face of the substrate; and wherein said step of implanting first dopants comprises implanting first dopants using the second mask as an implant mask.

8. The method of claim 7, wherein said step of implanting fourth dopants comprises implanting fourth dopants using the second mask as an implant mask.

9. The method of claim 8, wherein said step of forming a second mask comprises patterning an insulated gate electrode having an opening therein which exposes a second portion of the face of the substrate; and wherein said steps of implanting first, second, third and fourth dopants comprises implanting first, second, third and fourth dopants, respectively, into the second portion of the face of the substrate.

10. A method of forming an insulated gate bipolar transistor, comprising the steps of:

forming a buffer region of first conductivity type on a face of a semiconductor substrate of second conductivity type;

forming a drift region of first conductivity type on said buffer region, said drift region having a net first conductivity type dopant concentration therein which is less than a net first conductivity type dopant concentration in said buffer region;

forming an electrically insulating layer on said drift region;

forming a gate conductive layer on the electrically insulating layer, opposite said drift region;

forming a gate mask on the gate conductive layer, opposite the electrically insulating layer;

forming an insulated gate electrode on said drift region by etching the gate conductive layer and the electrically insulating layer to define an opening therein which exposes said drift region at a surface thereof, using the gate mask as an etching mask;

removing the gate mask; then implanting first dopants of second conductivity type into said drift region at the surface, using said insulated gate electrode as an implant mask;

diffusing the implanted first dopants into said drift region to define a base region of second conductivity type which forms a P-N junction with said drift region;

implanting second dopants of second conductivity type into said base region at a second depth relative to the surface, using said insulated gate electrode as an implant mask;

implanting third dopants of first conductivity type into said base region, using said insulated gate electrode as an implant mask;

diffusing the implanted second and third dopants simultaneously into said base region to define a latch-up inhibiting region of second conductivity type extending to the surface of said drift region and at least one source region of first conductivity type extending between said latch-up inhibiting region and the surface of said drift region;

implanting fourth dopants of second conductivity type into said latch-up inhibiting region at a fourth depth relative to the surface which is less than the second depth, using said insulated gate electrode as an implant mask; and diffusing the implanted fourth dopants into said latch-up inhibiting region to define a contact region of second conductivity type extending to the surface of said drift region.

11. The method of claim 10, wherein said steps of forming a buffer region and drift region comprise epitaxially growing a buffer region of first conductivity type on the face of said semiconductor substrate and epitaxially growing a drift region of first conductivity type on the buffer region.

12. The method of claim 11, wherein said step of implanting third dopants is preceded by the step of patterning a first mask on the surface of said drift region, in the opening in said insulated gate electrode; and wherein said step of implanting third dopants comprises implanting third dopants of first conductivity type into said base region, using said insulated gate electrode and said first mask as implant masks.

13. The method of claim 11, wherein said step of implanting first dopants comprises implanting first dopants into said drift region at a first depth relative to the surface of said drift region; wherein said step of implanting second dopants comprises implanting second dopants into said base region at the second depth which is less than the first depth; and wherein said step of implanting third dopants comprises implanting third dopants into said base region at a third depth relative to the surface which is less than the second depth.

14. The method of claim 13, wherein said step of implanting fourth dopants comprises implanting fourth dopants into said latch-up inhibiting region at the fourth depth which is less than the second depth.

15. The method of claim 12, wherein said step of implanting first dopants comprises implanting first dopants into said drift region at a first depth relative to the surface of said drift region; wherein said step of implanting second dopants comprises implanting second dopants into said base region at the second depth which is less than the first depth; and wherein said step of implanting third dopants comprises implanting third dopants into said base region at a third depth relative to the surface which is less than the second depth.

16. The method of claim 15, wherein said step of implanting fourth dopants comprises implanting fourth dopants into said latch-up inhibiting region at the fourth depth which is less than the second depth.

17. The method of claim 16, wherein said step of implanting fourth dopants is preceded by said step of removing the first mask from the surface of said drift region.

18. The method of claim 17, further comprising the step of forming a first electrode in ohmic contact with said substrate and a second electrode in ohmic contact with said at least one source region of first conductivity type and said contact region of second conductivity type.

* * * * *